United States Patent
Zuger

(10) Patent No.: US 7,381,661 B2
(45) Date of Patent: Jun. 3, 2008

(54) METHOD FOR THE PRODUCTION OF A SUBSTRATE WITH A MAGNETRON SPUTTER COATING AND UNIT FOR THE SAME

(75) Inventor: Othmar Zuger, Triesen (LI)

(73) Assignee: OC Oerlikon Balzers AG, Balzers (LI)

( * ) Notice: Subject to any disclaimer, the term of this patent is extended or adjusted under 35 U.S.C. 154(b) by 0 days.

(21) Appl. No.: 10/530,994

(22) PCT Filed: Oct. 15, 2003

(86) PCT No.: PCT/CH03/00674

§ 371 (c)(1),
(2), (4) Date: Sep. 7, 2005

(87) PCT Pub. No.: WO2004/036616

PCT Pub. Date: Apr. 29, 2004

(65) Prior Publication Data
US 2006/0124446 A1 Jun. 15, 2006

Related U.S. Application Data

(60) Provisional application No. 60/418,542, filed on Oct. 15, 2002.

(51) Int. Cl.
*H01L 21/00* (2006.01)
*C23C 16/00* (2006.01)

(52) U.S. Cl. .............. 438/795; 118/723 E; 204/192.12
(58) Field of Classification Search ................ 438/785; 118/723 E; 204/192.12, 192.13
See application file for complete search history.

(56) References Cited

U.S. PATENT DOCUMENTS

| | | | | |
|---|---|---|---|---|
| 5,108,574 A * | 4/1992 | Kirs et al. | ............. | 204/298.22 |
| 5,171,415 A | 12/1992 | Miller et al. | | |
| 5,284,564 A * | 2/1994 | Maass | ...................... | 204/298.2 |
| 5,659,276 A * | 8/1997 | Miyata | ...................... | 335/209 |
| 5,833,815 A | 11/1998 | Shik | | |
| 6,093,290 A * | 7/2000 | Tamura et al. | ......... | 204/192.12 |
| 6,365,010 B1 * | 4/2002 | Hollars | .................. | 204/192.12 |

FOREIGN PATENT DOCUMENTS

WO     WO 00/71774 A1    11/2000

* cited by examiner

*Primary Examiner*—W. David Coleman
(74) *Attorney, Agent, or Firm*—Kurt Rauschenbach; Rauschenbach Patent Law Group, LLC

(57) ABSTRACT

According to the invention, the distribution of material amounts deposited on the substrate may be optimized for magnetron sputter coating in which a magnetron magnetic field pattern (9) is cyclically ($M_y$) moved along the sputtering surface (7) and a substrate (11) is passed along the sputter surface (7), whereby the sputter rate is modulated by means of a modulation device (3), phase-locked with the cyclical movement ($M_7$) of the field pattern (9).

42 Claims, 5 Drawing Sheets

Figure 1:
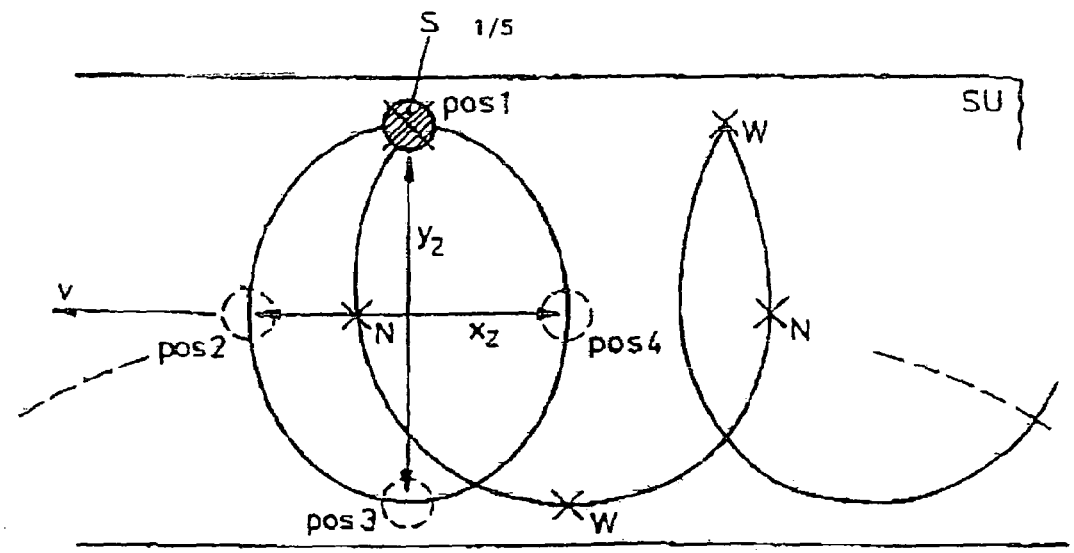

METHOD FOR THE PRODUCTION OF A SUBSTRATE WITH A MAGNETRON SPUTTER COATING AND UNIT FOR THE SAME

RELATED APPLICATION SECTION

This application claims priority to U.S. Provisional Patent Application Ser. No. 60/418,542, filed on Oct. 15, 2002, entitled "Methods and Apparatus for Coating Substrates," the entire application of which is incorporated herein by reference.

WO 00/71774 of the same applicant as of the present application, discloses, that in a case of a sputter source, which has been "operational point stabilized" and is used in a reactive coating process, at which said source, a planar substrate, situated parallel to the sputter surface, can be moved in a circular path relative to the sputter surface to compensate for a so-called "stringy effect". The term "stringy effect" is to be understood as an unequal apportionment of the quantity of material deposited on the said substrate in the direction of the movement of the substrate. This is essentially disturbing in that, because of the circular path, and because of the planar state of the substrate, different substrate zones build themselves parallel to the sputter surface as the deposition experiences different distances of separation and angular relationships with the sputter surface. The different coating rates which evolve from the above, extending in the direction of motion of the substrate, are compensated for in that, synchronously with the substrate movement over the sputter surface, the treatment atmosphere is modulated in accord with a given profile.

In addition, magnetron sputtering is known. In this process, by means of the sputter surface, one or more, preferably self closing, loops of tunnel shaped magnetic fields form from the sputter surface, aligning themselves out of and within this said surface. Because of the electron drop known in a magnetron-magnetic field interacting with an applied electrical field, there arises in the area of the said tunnel shaped magnetron magnetic field pattern, an increased density of plasma, which, on its own, leads to an increased sputter rate in this zone. The sputter rate achieved by means of magnetron sputtering is essentially greater than sputtering which is not supported by a magnetic field. Because, however, along the magnetron magnetic field pattern, an increased sputter rate occurs, in the sputter surface eroded grooving appear, which are generally known as a "race track" presentation. This so-called race track then leads to a circumstance, wherein a poor usage of the sputter target material results.

Primarily based on these grounds, one comes to the conviction, that the magnetron magnetic field pattern, while the source is active, must be moved above the sputter surface and thereby, to the greatest possible extent, distribute an increased sputtered material deposition below the said pattern and consequently over the entire sputter surface in the given time. Thus, it can be additionally achieved, that, in a case of reactive magnetron sputtering with a movable magnetic field pattern, an essentially reduced poisoning of the target, that is to say, forming a disturbed coating of target surface areas, which have poor electrical conducting interbindings which are needed for a successful reactive process. In the case of reactive coating processes, that is, the production of a coherent layers, for example, starting from a metallic target in the presence of a reactive process gas, possibly oxygen, for the deposition of metal oxide layers, because of a mobile magnetron magnetic field pattern, a uniform, cyclic erosion of the sputter surface occurs, whereby a disturbance of the coating, here an oxide layer, is considerably reduced. This action leads to increased process stability. On this account, it is generally not necessary to provide an operational point stabilization by control, where reactive magnetron sputtering with a mobile magnetron magnetic field pattern is carried out.

Normally, the cyclic movement of the magnetron magnetic field pattern along a sputter surface is realized in one or two dimensions. Thus it becomes possible, for example, in the case of a long, rectangular target, that a pattern which forms a closed loop can be cyclically moved back and forth in the longitudinal direction of the target, whereby this movement is cyclic in one dimension. Again, in the case of a target arrangement which is extended into two dimensional directions, then the magnetic field pattern is cyclically reciprocating in both directions, which leads to a movement path of the magnetic field along the sputter surface in accord with a Lissajous-figure. The cyclic magnetic field pattern movement can be attained, especially in the case of round targets, principally by means of a rotational movement, which can be either in circle form or as an oscillating, pendular motion, which takes place in relation to a vertical axis from the sputter surface. In this operation, it is immediately obvious, that in regard to this said axis, the magnetic field pattern must not be circular.

Magnetic field patterns which are rotational, are already known, which are simply mirror-symmetric to an axis in a plane parallel to the sputter surface. Such magnetic fields are, for example, in the form of hearts, apples, kidney and the like as may be taught by the following U.S. patents:

U.S. Pat. No. 4,995,958
U.S. Pat. No. 5,252,194
U.S. Pat. No. 6,024,843
U.S. Pat. No. 6,402,903.

Further, the shapes may be double mirror-symmetric in form, as seen in the figure "8", in accord with U.S. Pat. No. 6,258,217, thus mirror-symmetrical to two axes, which are perpendicular to one another in the said plane.

In addition to the above, a process is known, of moving the substrate, which is to be coated, during the coating procedure, along the sputter surface with the mobile magnetron magnetic field pattern. This is especially advantageous, for the so-called "Batch-Equipment", wherein several, even a multiplicity of substrates are coated during one equipment coating cycle.

The requirements of the local apportionment of the thickness of the coating, that is to say, the requirements on the off-sputtered materials along the substrate surface, are in many cases, very high. In the case of optical coatings, for example, such as found in applications regarding components for projection displays, it is necessary that coated substrates have a layer-thickness apportionment, which deviates at the most, 1% from the average thickness for an area of 1000 $cm^2$, in order to assure a favorable economic production of coatings consisting of only few layers up to perhaps 50 layers. In the application of so coated substrate for optical data transmission, then coating thickness deviations of, at the most, 0.01% in reference to the average layer thickness are demanded. In this case the produced surfaces would be at the least, 10 $cm^2$. In this latter case, onto such substrates, up to more than 100 individual coatings may be laid in processes with durations between 12 and 50 hours.

Fundamentally, the basics lie therein, in that by the use of a magnetron source with a sputter surface, wherein a magnetron magnetic field pattern is cyclically moved along a sputter surface, and substrate is specifically distanced from the sputter surface and moved thereover, one will gain the largest possible substrate surfaces having the smallest possible deviations of the coating thickness—in the case of reactive coating processes of the deposited quantity of the off-sputtered materials—along the substrate surface. When we speak, in this connection, of the "coated substrate surfaces", we mean the entire combination of such surfaces of a plurality of batch-treated small substrates or the surface of one large substrate.

We speak in the following in regard to the apportionment of the coating thickness and understand, in this respect, the apportionment of the quantity of off-sputtered materials onto the substrate surface for reactive processes, which, in the case of said reactive processes, does not have to depend on a linear correlation with the thickness of the layer.

In order, that in the use of a round magnetron source having the substrate movement as described, static components are inserted to reach an acceptable coating thickness apportionment, presently, between the motion path of the substrate and the sputter surface, which establish the apportionment of the material flow between the sputter surface and the substrate, these components are known as aperture orifices or "Shaper Orifices". Normally, in this case, the said aperture orifices are combined with the circular disk shaped sputter surfaces, and, as has been mentioned, the magnetic field pattern cyclically moves along the sputter surface by rotation about an axis vertically extending from the sputter surface.

The provision of components of this type, such as the said shaper orifices, does well to enable the achievement of layer thickness apportionments on the mobile substrate with deviations from the average of the layer thicknesses of less then 1%, but only when one takes into consideration, the essential disadvantage, that by means of such interposed components considerable quantities of sputtered material are masked out before they reach the substrate, wherewith, at a uniform sputter rate the coating rate is essentially reduced. These components, which often must be matched to the currently employed sputter sources, and upon each modification, especially the magnetron magnetic field pattern and its motion must be set up anew and optimized with the aid of iterated steps, while the coating process itself produces a disturbed layering. Because of the considerable heating of such components in the process space, layer tensions can arise, which, for example, together with thermally conditioned shaping changes, such as the distortion of such components, lead to a situation, in which the mentioned disturbed layer can exfoliate and deposits on the substrate can lead to coating defects Thus it is the purpose of the present invention, to propose a procedure for the production of magnetron sputter coated substrate of the kind described in the opening passages, as well as proposing equipment designed for the said procedure, to achieve the result, that substrate with essentially improved apportionment of sputtered off material is deposited along the sputter coated surface with essentially reduced material flow masking as compared to the heretofore attainable apportionment with the described reduced masking.

This will be achieved with a production procedure of the type mentioned in the introductory passages of this description, in that, in accord with the wording of the characterizations of claim 1, the quantity of material deposited per time unit on the substrate is cyclically changed in conformity with the phase locking of the cyclical motion of the magnetic field pattern.

So that the present invention can be immediately understood at this place, its principle, as set forth in FIG. 1 will be explained.

In FIG. 1, the cross-hatched circle S depicts a position of a magnetron sputter source on a sputter surface, at which position the maximum sputter rate is generated. A position S of this nature represents, accordingly, a section of the area of the magnetron magnetic field pattern. Since, in the case of FIG. 1, the existing and here concerned phenomena known to the invention are outlined schematically, only this position S should be taken as representative of the increased sputter rate in the area of the magnetron magnetic field pattern. By means of the two dimensional cyclic motion shown here, namely, a cyclic movement $y_z$, and, at right angles thereto, a cyclic motion $x_z$ would produce an elliptic movement path, along which the position S moves itself above the sputter surface.

Above and along the sputter surface with the two dimensional, cyclic movable position S, runs a substrate SU with a uniform speed v. If one assumes, that the position S at a specific period proceeds from one position, pos. m to the next position, pos. m+1—as is shown in FIG. 1—within equal times, then there is built upon the substrate SU, those layers, the location of which are marked with a cross X. It is immediately obvious, that upon the substrate SU, a cycloid path is being followed.

Examination also shows, that the position S dwells for a longer period in the flex points about $X_W$ than in the zero-transient points $X_N$. This has the result that in the edged or peripheral areas of the substrate SU, a larger quantity of material of the released material is deposited than in the central sections.

If one now makes use of the present invention on the base of the theoretically presented relationships as shown in FIG. 1, and changes, by means of the cyclic and phase locked per-time-unit relationship, the quantity of material deposited on the substrate in such a manner, that the said quantity is always diminished, when the position S lies on the areas $X_W$, and the said quantity is always increased, when the position S crosses over the areas $X_N$, then the achievement is, that the said inhomogeneous apportionment of the coating materials laid down upon the substrate SU in the y-direction is adjusted into a homogeneous and desired apportionment.

In an advantageous embodiment of the invented production method, the cyclic motion of the magnetron magnetic field pattern is made two dimensional, preferably realized by means of a pendular or a circular rotational movement about an axis perpendicular to the sputter surface, which has the end result of curving in Lissajous figures.

Further, the cyclic motion of the magnetic field pattern need not be in any case necessarily two-dimensional. If, for example, where a longitudinally extended target is involved, the magnetic field pattern is only cyclically moved in the said longitudinal extension of the sputter surface on the longitudinal target and the substrate is displaced perpendicularly to this movement. In this case, the said inhomogeneities of the deposition thicknesses on the substrate in the direction of the target longitudinal extension, in accord with the invention, can be compensated for by a cyclic change of the sputter rate along with phase lock of the cyclical motion of the magnetic field pattern.

It is quite possible, to bring about the cyclic change of the material quantity laid down on the substrate along the sputter surface in a localized manner. In a considerably more favorable embodiment, the proposal is made, that changes in the deposited quantity of material can be phase locked simultaneously in common with the cyclic motion of the magnetic field pattern over the entire sputter surface.

Definition:

We understand in regard to two mutually phase locked cyclic signals, two periodic signals, which, respectively, in accord with a fixed number of periods of one of the signals, are again in the predetermined phase relationship with one another. Seen within a given window of time, their frequencies $f_1$ and $f_2$ differ from one another by a factor corresponding to a rational number.

In a most advantageous manner, over the entire sputter surface a deposited quantity of material can be simultaneously changed, in that the sputter-power is changed.

Instead of, or rather in addition to, the change of the deposited quantity of material by means of a change of the sputter power, it is possible that the said quantity of material, localized or even over the entire sputter surface can be changed, by an alteration in the reactive gas flow and/or by adjusting the operational gas flow, such as, for example, a flow of argon in the process space.

Beyond this, it is possible, and preferable, to have the sputter surface consist uniformly of a single material for sputtering, such as of one metal, a metal alloy or a metal composite. It is, however, further possible, by the use of a multicomponent target, to have surface sections of materials of differing sputtering characteristics.

If one again observes FIG. 1, again theoretically, it can be recognized that the deposited quantity of material should then possess a minimum, when the position S takes up a location $X_W$ on the substrate SU. In this respect, it is understandable, that in a further approved embodiment, the phase locked, cyclical change of the material quantity can be realized by a curve in respect to the time, the frequency spectrum of which has a dominant spectral line at the said double frequency in regard to the frequency of the cyclic magnetic field pattern movement.

In an additional advantageous embodiment, it is also proposed, that, the mentioned curve possesses a further dominant spectral line upon the frequency of the cyclic magnetic field pattern motion. This becomes particularly evident, when not, as is shown in FIG. 1, the substrate SU moves linearly above the sputter surface, seen in FIG. 1 as a top view of the sputter surface, but, in just such a top view, here drawn in cross-hatching, the substrate SU moves preferably in a curved track, that is, a circular path with a center of curvature outside of the sputter surface.

In regard to the proposal cited immediately above, fundamentally, where a two dimensional, cyclic motion of the cyclic magnetic field pattern is concerned, that particular movement component is decisive, which is perpendicular to the movement direction of the substrate, still seen as in top view against the sputter surface. The cyclic movements of the magnetic field differentiate themselves in FIG. 1 in the y- and the x-axis. If the movement of the substrate is carried out with a component in the x-direction, then, correspondingly what is decisive, is that the cyclic magnetic field pattern motion must be in the y-direction for phase locking with the cyclic change of the sputter rate.

In another advantageous embodiment of the present invention, the magnetic field pattern is designed to be mirror-symmetric to an axis in one plane, which plane is parallel to the sputter surface, or mirror symmetric to two, mutually perpendicular such axes.

In an additional preferred embodiment, namely, for reactive magnetic sputter coatings, a reactive gas is provided in the process space between the sputter surface and substrate.

Although by no means compulsory, advantageously, additionally a circular sputter surface can be employed, with simplifies the complete assembly of the magnetron source.

In a further approved embodiment of the present invention, between the sputter surface and the substrate none of the material-flow disturbing components exists in relation to the aforementioned aperture orifice.

Advantageously, the curve of the phase locked, cyclic change of the material quantity deposited on the substrate is selected dependent upon the relative motion between the substrate and the sputter surfaces and/or dependent upon the shape of the magnetic field pattern and/or dependent upon the cyclic magnetic field pattern movement.

During the operational life of the source targets, which define the sputter surface, the geometry of the sputter surface undergoes change, because of the erosion of sputter. This, in turn, gives rise, during said operational life of the target, to a changing apportionment within a cycle of the magnetic field pattern motion of the off-sputtered materials from the sputter surface and therewith a changing of the apportionment of the quantity of material carried to the substrate surface. Such a change of the sputter characteristics at the source itself cannot be corrected by means of provided static components such as the said aperture orifices. Conversely, the present invention opens the possibility, to take up just such phenomena regarding the apportionment of specified substrate layer thicknesses, since, in accord with a further advantageous embodiment of the invention, the procedure of the phase locked, cyclic change is subjected to a time-change. With such a time based alteration of the procedure of the phase locked cyclical change, for example, the amplitude or the curve shape thereof, can be thoroughly controlled and executed in accord with empirically based values by means of a given process. In another advantageous embodiment, this is done in that one measures the material apportionment as it has been immediately deposited on the substrate as a "rule quantity". This said rule quantity is then compared with a standard apportionment and then, in accord with the direction of the comparison results, namely a "rule difference", the procedure of the phase locked, cyclic change is presented as a standard value, in a control circuit for the quantity of material distribution. In this way, it becomes possible to automatically undertake a resulting shift in material apportionment. In a completely different, but favorable, embodiment of the invention, the substrate can be moved over the sputter surface a plurality of times. This is done advantageously, in that the substrate is guided cyclically over the sputter surface, which can be in a regulated to and fro movement.

In a preferred manner, the substrate is linearly moved parallel to the oppositely situated sputter surface. When this occurs, it can be moved, in a first additional, advantageous way, in a plane parallel to the sputter surface or in a second favorable manner, in which the substrate is moved, again situated opposite to the sputter surface, not linearly as before, but rather in an advantageously circular path.

If the substrate, planarly situated parallel to the opposing sputter surface is linearly moved, then, favorably, and as explained above, in each case the phase locked, cyclic alteration of the quantity of material is carried out in a procedural run, the frequency spectrum of which evidences a dominant spectral line in a case of a doubled frequency in relation to the frequency of the cyclic magnetic field pattern motion. This takes place, in both cases, first, if the substrate is moved in a plane parallel to the sputter surface, and second, if the substrate, aligned planarly parallel to the sputter surface, is moved non-linearly, that is along the said circular path.

If now, the substrate, again planarly parallel to the sputter surface, is moved non-linearly, preferably along the said circular path, then it can be demonstrated, that additionally to the said quantity of material deposited on the substrate by means of the cyclic motion of the magnetic field pattern phase locked variation, then the said quantity of material can be changed synchronously with the movement of the substrate, as this is amply explained in WO 00/71774.

If the substrate motion is carried out, in a nonlinear manner, again planarly parallel opposed to the sputter surface, in this case preferably along a circular path with the radius of curvature being outside of the sputter surface, then the course of the cyclic variation of the quantity of material, over a time period, is formed with a dominant frequency component both in a case of the double as well as an equal frequency, in relation to the frequency of the cyclic patter motion. Although, in addition, in accord with the present invention, the possibility exists of achieving the striven for, desired layer thickness apportionment profile on the substrate, it is also possible in a highly preferred manner to realized on the substrates an optimized, homogenous layer thickness apportionment. In this way, again advantageously, planar, magnetron sputter coated substrates are produced.

A magnetron sputter coating apparatus in accord with the present invention consists of a magnetron source and a cyclically driven magnet arrangement underneath a sputter target, situated in a plane parallel to the sputter surface, and consists further of a substrate transport apparatus, by means of which a substrate is moved above the sputter surface. This so defined magnetron coating apparatus then has a modulation arrangement for the per-time-unit of sputtered quantity of material from the said source, and this quantity is modulated cyclically and with phase locked with the cyclic motion of the said magnet arrangement.

Advantageous embodiments of the magnetron sputter coating apparatus in accord with the present invention are specified in the claims 29 to 36.

Figure 2:
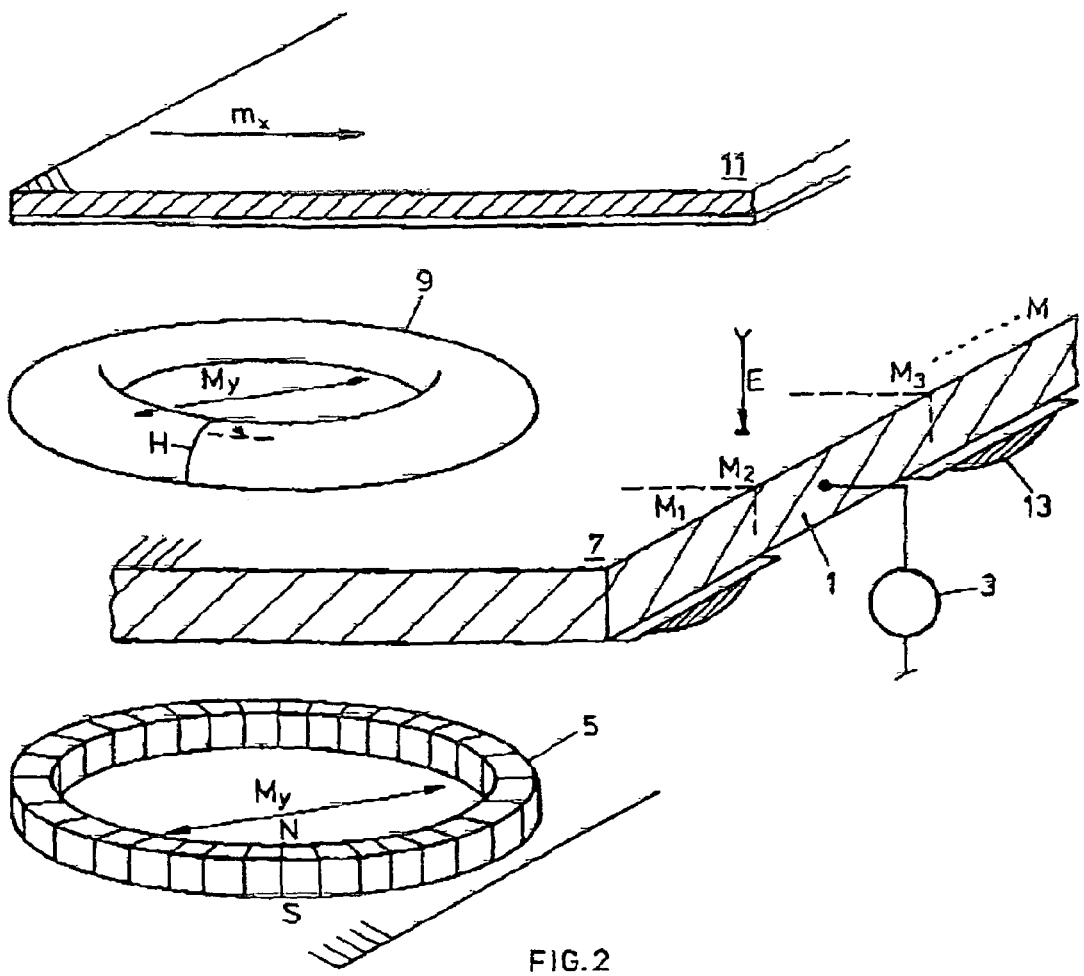
Figure 3:
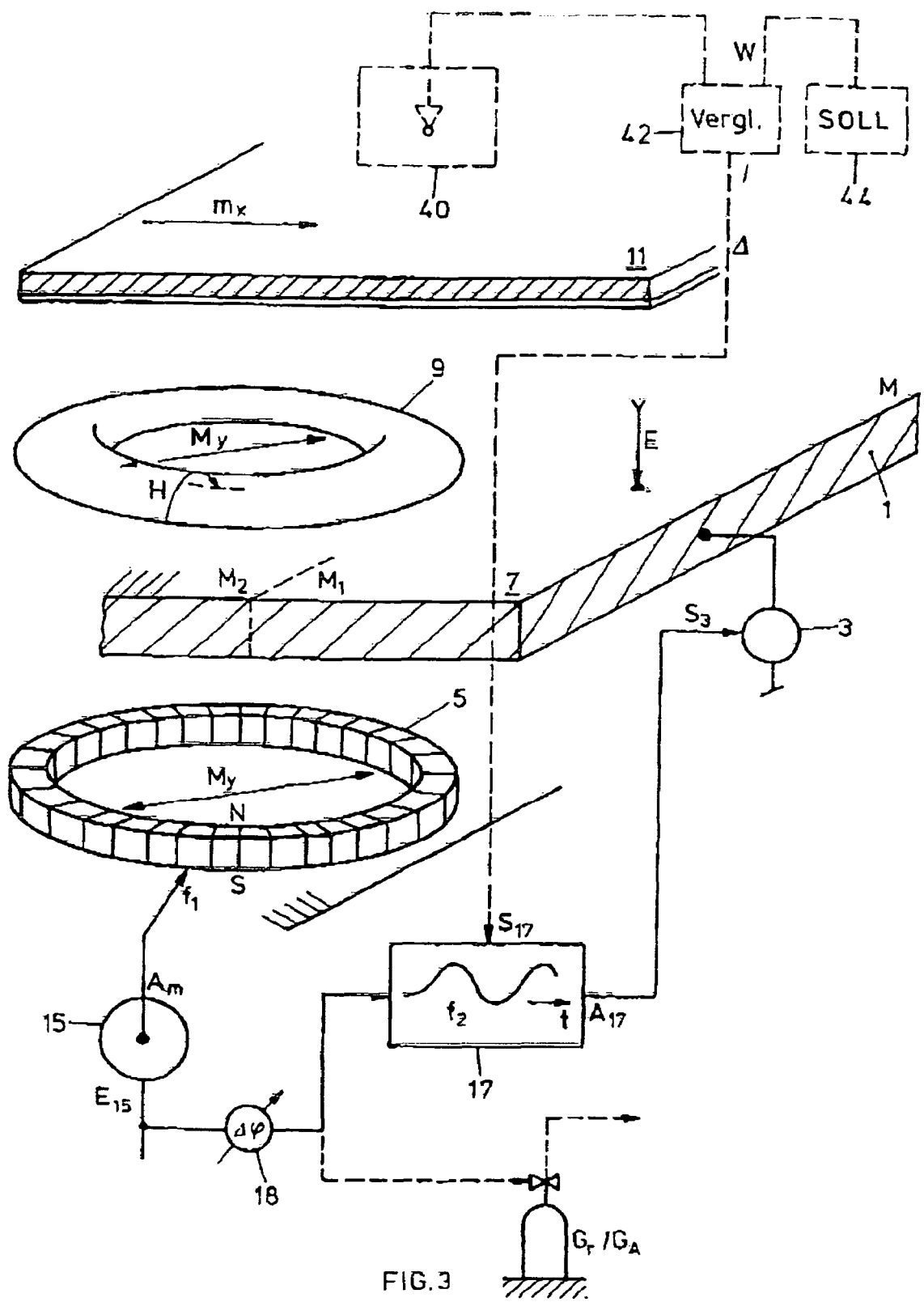
Figure 4:
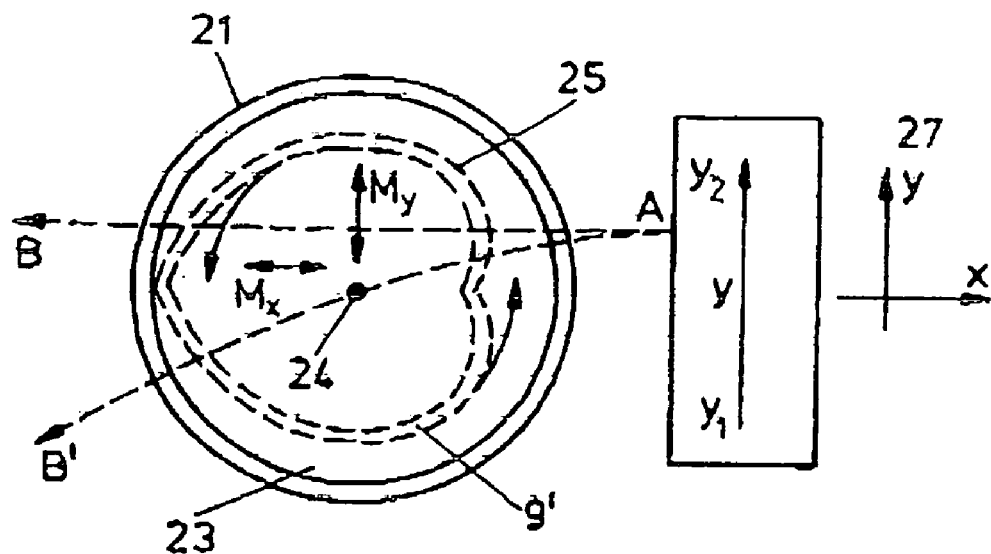
Figure 5:
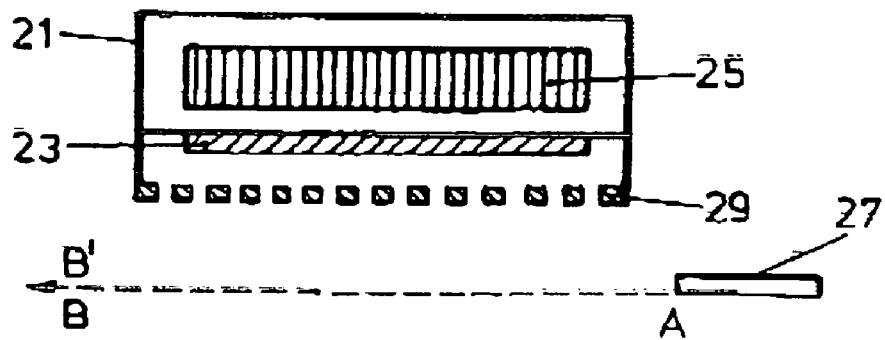
Figure 6:
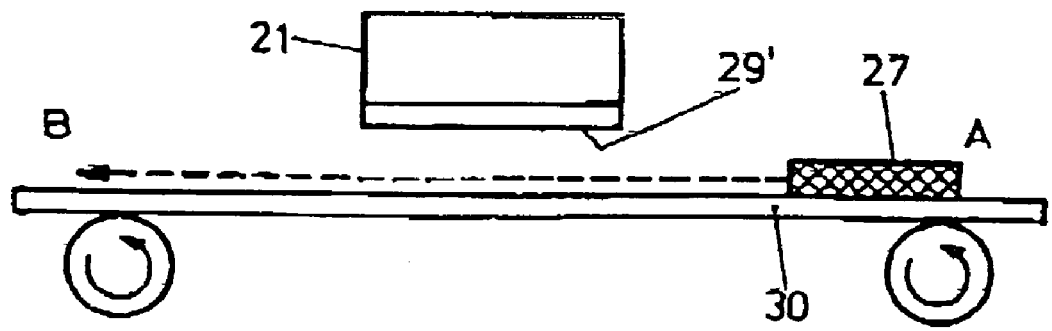

The invention is now explained, for example, with the aid of Figures. These show in:

FIG. 1, schematically presented, and without claim on physical exactness, the distinguishing relationships, which serve as a basis for the present invention of a magnetron sputter source with a mobile magnetron magnetic field pattern and moveable substrate, FIG. 2, schematically and simplified, a first embodiment of the invented method, that is to say, an invented apparatus, FIG. 3, in a presentation analogous to that of FIG. 2, a preferred embodiment, as of the present day, of the invented method, that is to say, of an invented apparatus, FIG. 4, a plan view, of an advantageously employed rounded magnetron source within the bounds of the invention, with various paths of motion corresponding to the present invention, of a substrate as a basis for a consideration of the path-specific optimized design of the present invention, FIG. 5, the source, in accord with FIG. 4, schematically presented cross-section, FIG. 6, schematically, and highly simplified, an inline magnetron sputter coating apparatus, whereby the substrate, mobile in relation to the said source is realized, the said mobile substrate being as presented in FIG. 4

Figure 8:
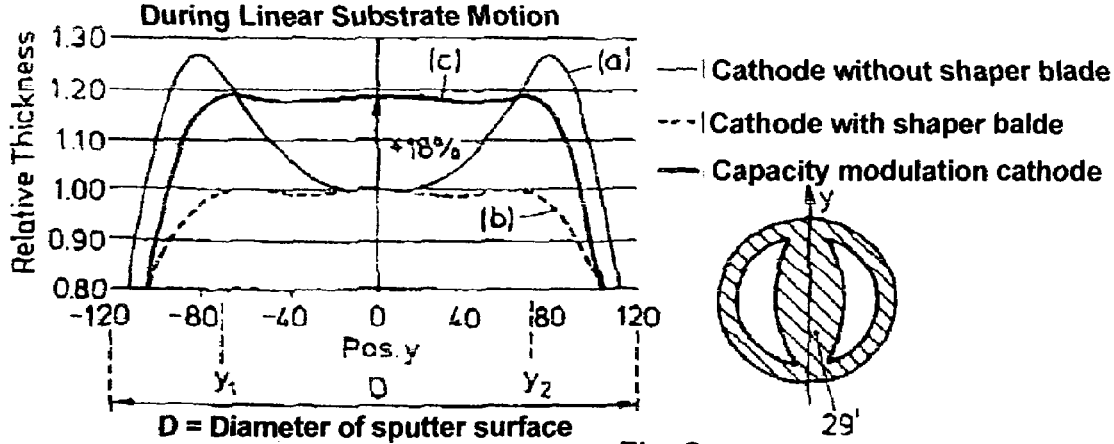
Figure 9:
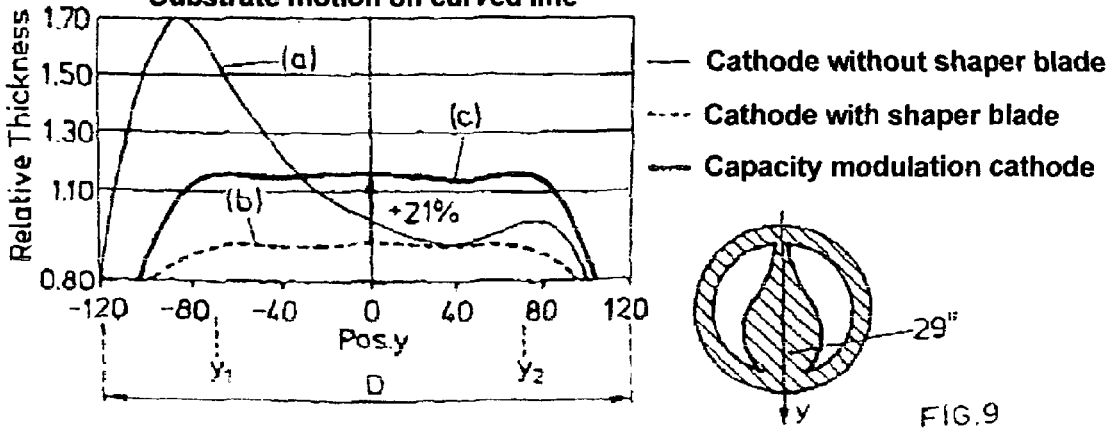
Figure 10:
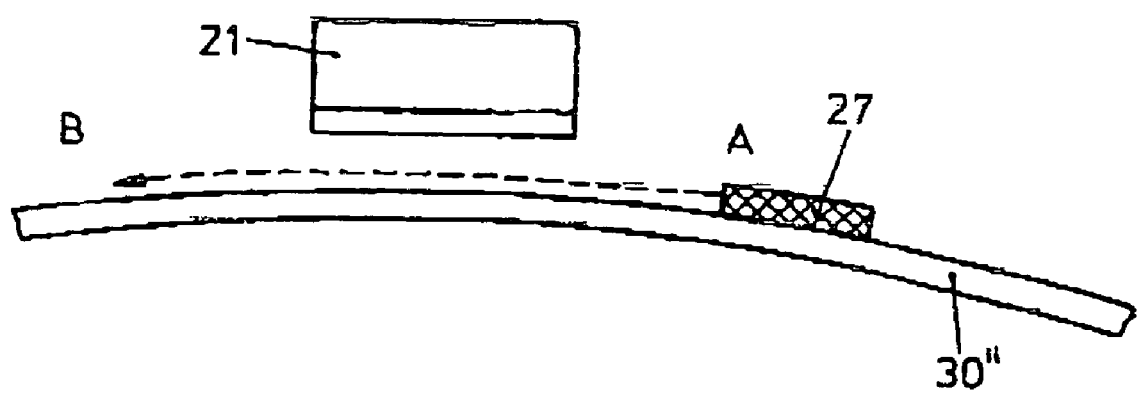

FIG. 7, once again schematically and highly simplified, an apparatus, wherein substrates traveling on a circular path are moved past the source in accord with second movement-method presented in FIG. 4,

FIG. 8 and FIG. 9, layer thickness apportionments on the substrate, accruing deposited material in relation to their direction of motion, without any compensation, (a) with, as in the known manner, a provided aperture orifice, (b and c) realized with the present invention, and in FIG. 10, an additional type of the relative motion between substrate and the source.

In FIG. 2, simplified and schematic, is shown a first embodiment of an invented magnetron sputter coating apparatus, i.e., a first variant of the method of production in accord with the present invention.

A target 1, advantageously of one piece and of a material M or, one or two pieces (note dotted lines) from respectively the materials $M_1$, $M_2$, . . . . A magnetron sputter source, not presented in details, is fed by means of an electrical generator arrangement 3 in reference to a (not shown) anode of the said source. This feed is normally DC, if necessary both with DC and AC or only with AC, with the current in the high frequency area $R_f$. Thereby, the schematically drawn in electrical field E, which was presented in FIG. 1, is shown in the known means and way. Beneath the target 1 is provided a magnet arrangement 5, the magnetic field of which penetrates through the target 1 with field lines which protrude from and reenter into the sputter surface 7. The field lines H form a field pattern 9 in the shape of a closed, tunnel-like loop. The magnetron magnetic field pattern, in a known manner, leads commonly with the electrical field leads to a marked plasma density increase in the area of the magnetic field pattern 9 with a therewith resulting increase of the sputter rate. The magnet arrangement 5 generates in most cases, as already mentioned, the magnetic field pattern 9 on the sputter surface 7, which field then appears as closed loops.

As FIG. 1 shows further, with (not depicted here) driving means, the magnet arrangement 5 moves along the target 1 in a back and forth manner, in at least in the y-direction in accord with FIG. 1, this being a cyclic movement, as is indicated by the double arrow $M_y$. With the magnet arrangement 5 being underneath the target 1, the magnetic field pattern 9 moves uniformly along the sputter surface 7.

Distanced from the sputter surface 7, a substrate 11 is moved past said sputter surface, doing this with at least a motion component $m_x$, which is perpendicular to the magnetic arrangement 5 and thereby perpendicular to the magnetic field pattern 9. In accord with the fundamental principle of the present invention, the rate of the materials sputtered from the said sputter surface 7 changes cyclically in accord with phase locking with the cyclic movement $M_y$ of the magnet arrangement 5. In other words, the magnetic field pattern 9 is modulated. These said changes can be realized with the embodiment of FIG. 1, in that between the magnetic arrangement 5 and the sputter surface 7 in the motion direction $M_y$ of the magnet arrangement 5, the magnetic resistance of the penetrating power (punch-through) between the magnet arrangement 5 and the sputter surface 7 locally varies or is locally modulated. As is schematically depicted in FIG. 1, it is possible to bring these changes about by adding locally increasing material inserts 13 to the magnetic resistance of the target 1, whereby, along the sputter surface 7, the field strength H of the magnetic field pattern 9 will be locally modulated, as will the thereto associated sputter rate. This opens for the expert additional possibilities of modulating the sputter rate locally and in phase locking with cyclic motion of the magnetic arrangement 5. Among these possibilities would be, modulating the sputter rate:

by provision of electro magnets on the magnet arrangement 5, by mechanical displacement of individual magnets of the said magnet arrangement 5, by modulation of the separating distance between the magnet arrangement 5 and target 1, and the like.

Fundamentally, in the case of a procedure based on FIG. 1, the sputter rate along the sputter surface 7 is thus locally modulated.

In FIG. 3 is a presentation, showing, analogously to FIG. 2, an additional fundamental embodiment of the present invention, which embodiment, at least now, can be clearly set forth. Having at hand the procedures and components of FIG. 2, the same are depicted again in FIG. 3 using the same reference numbers, and need not be described once again. As is illustrated in FIG. 3, the movement $M_y$ of the magnet arrangement 5 is effected by a drive 15. The electrical generator assembly 3 for the target 1 has a control entry (or a modulation entry) $S_3$. An operational default 17 of the method, the output $A_{17}$ of which, is in active connection with the control entry $S_3$, produces a cyclic, periodic modulation signal for the generator assembly 3 with a specified, preselected course of operational running. If one designates the cyclic frequency of the motion $M_y$ of the magnetic arrangement 5 and therewith, that of the magnetic field pattern 9 with $f_1$, then the frequency $f_2$ of the periodic control signal, which is produced at the unit 17, is being selected as $n \cdot f_1$, where n is a rational number. The periodic control signal of frequency $f_2$, which is conducted to the control input entry $S_3$, is phase locked with the cyclic movement $M_y$ of the magnet arrangement 5 with the frequency $f_1$. This means that the phase position of the control signal, in reference to the cyclic movement $m_y$, is respectively equal to a given number n of periods of the cyclic control signal. In this respect, there exists an entry of the default unit 17 accommodating the mechanical outlet $A_{17}$ of the drive 15 or, and preferentially, an active connection with the electrical entry $E_{15}$ of the drive 15, as is schematically illustrated, this being done advantageously by means of an adjustable phase presetting unit 18. At the unit 17 are provided, advantageously, additional inlets $S_{17}$, onto which values of the cyclic control signal curve, especially frequency $f_2$, can be adjusted as to a curve shape with the amplitude and the like.

As shown in FIG. 3, again presented schematically and in dotted lines, it is possible, changes can be made, so that instead of, or in addition to, the advantageous variation of the sputter capacity, by means of the generator assembly 3, phase locked by means of phase preset unit 18, a reactive gas $G_r$ and/or a working gas $G_A$ such as argon can be fed into the reaction space between the sputter surface 7 and the substrate 11. The change can, in this respect, be made on a wide spread basis over the entire sputter surface 7, or locally along predetermined areas of the said sputter surface 7.

Differing from the embodiment in accord with FIG. 2, in the case of the embodiment following that of FIG. 3, which is preferred today, the sputter rate on the sputter surface 7, which is phase locked with the cyclic motion of the magnet arrangement 5, is not locally changed, but rather the entire existing sputter rate at the sputter surface 7, phase locked with the magnet arrangement motion $M_y$, is changed.

In FIG. 4, schematically shown, and in top view, is a round-magnetron sputter source 21, which is both in keeping with the present invention and can be advantageously employed. Illustrated is the target 23 thereof, i.e., the sputter surface of the magnetic field pattern 9' and this is drawn in dotted lines thereon. The magnet arrangement 25 is designed in the here presented top view, mirror image symmetrically to an axis which is situated parallel to the said sputter surface of the target 23 and the said arrangement is cardioid is shape. The reference number 27 designates schematically the substrate which is movable, in accord with the invention, in the x-direction. The cyclic movement of the magnet arrangement, as located in FIGS. 2, 3 is, in this case, here in an advantageous manner, realized as a two dimensional cyclic movement, with the movement components $M_y$ and $M_x$ running at the same frequency. This cyclic, two dimensional motion is advantageously, and also as presented in FIG. 4, effected by a rotation of the magnet arrangement 25 about the axis 24.

Obviously, it is possible, if required, instead of a circular rotation, to employ a rotating pendulous motion. In addition, instead of the presented single axle mirror symmetrical magnet arrangement 25, another form of the magnet arrangement can be used. Especially is it possible, as has already been mention in the introductory passages to consider a double axis, mirror symmetrical magnet arrangement, for instance in the form of the numeral "8" with a central rotation axis 24, for example, this being the center of possibly also a kidney shaped unit.

In FIG. 5, the round magnetron sputter source, as per FIG. 4, is schematically shown in cross-section, wherein the reference number 29 designates the mounting location of a conventional aperture orifice, this being indicated by dotted lines. In regard to this, it should be emphasized, that in accord with the present invention, only under the greatest considerations, would be the installation of a designed aperture, which would allow masking of the sputtered off materials from the sputter surface to be essentially much less than the conventionally installed apertures. In other words, in accord with the present invention, the required layer deposit thicknesses can be attained entirely without the provision of such components.

Advantageously, the substrate 27 can be passed by the source 21 many times, if this is in a direction which remains unchanged, or if this is a back and forth motion.

As has already been mentioned, the modulation curve form, which is used in accord with the invention, modulates the sputter rate. The said sputter rate is phase locked with the magnet arrangement-cyclic motion. The sputter rate is that deposited quantity of material during any given time period and is dependent upon the shape of the magnet arrangement and its motion dynamics, and further dependent upon the moving path and dynamic of the substrate motion. For example, there is presented in the following, three cases which will be examined. The first and second cases are found in the FIGS. 4, 5 wherein the substrate 27 is moved in a plane parallel to the sputter surface of the target 23. The said movement is linear in respect to the dotted path A-B or non linear in accord with the alternate path A-B', thereby advantageously on a circular path about a (not shown) center Z which lies outside of the sputter surface of the target 23. The third case comprises a movement of the substrate 27 upon a linear path, such as A-B is, as a rule, given in the case of so-called inline-coating equipment. Such an in-line coating equipment example is shown in FIG. 6. The substrate lies, in this case, on a substrate carrier and would be, as though it were on a running belt, passed one or more times, preferably the latter, linearly beneath the sputter source. In the case of the previous procedure, a provided aperture orifice would have been installed at location 29, if the installation were not in accord with the present invention.

Figure 7:
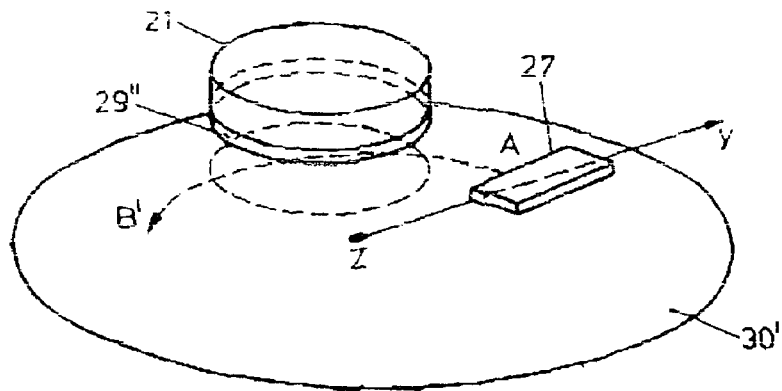

FIG. 7, schematically, shows how the non-linear motion path A-B', as per FIG. 4, for example, is carried out. In this case, the substrate 27 is on a disk shaped or a domed substrate carrier 30', with a center of rotation z outside of the sputter surface of the source 21. In FIG. 7, the reference number 29" provides the location, where, in accord with up-to-now technology, an aperture orifice must be installed.

In accord with FIG. 4, the substrate 27 possesses a range with an extension in the y-direction from $y_1$ to $y_2$, which, with specified layer thickness apportionment, should be, as much as possible, coated with a homogeneous layer. In accord with the present invention, with a modulation of the sputter capacity, the sputter rate for each position of the rotating magnet arrangement 25 is directly influenced, in order that, by an appropriate selection of the modulation curve, a homogenization of the resulting layer thickness on the substrate can be attained, without the installation of an aperture orifice or, at the most, with the installation of an aperture orifice with essentially less sputter masking properties than would be the case with conventional apertures.

As has already been made plain in FIG. 1, confirmation has been made, that in the case of the linear movement A-B, or for that matter, where any linear motion component is concerned, it is of advantage to select the basic modulation frequency in accord with $f_2$ of FIG. 3 at the doubled rotational frequency $f_1$ of the magnet arrangement 25, 5 under such circumstances, that no additional asymmetries need be corrected. In this way, a modulation curve form is advantageously chosen at the default unit 17 (FIG. 3), which has in its frequency spectrum at $2f_1$ at a transcending spectral amplitude. The rotation frequency, i.e. the cyclic frequency in accord with $f_1$ of the magnet arrangement 25, 5 must be set so high, that during the movement of the substrate 27, 11 as it passes the source, the magnet arrangement 25, 5 runs through a plurality of cycles, which is assured by a corresponding increase of the magnet arrangement cyclic frequency, i.e., a slowing of the substrate velocity. Typical cyclic frequencies of the movement $M_y$, again as shown in FIG. 3, or in other words, the rotation in accord with FIG. 4, lie in that Hz range generally between 0.1 and 10 Hz and the movement of the substrate 27, 5, as it passes the sputter source endures for several seconds, even when the substrate is passed by the magnetron sputter source only once. In the case of a multipassage of the substrate past the sputter surface, the substrate motion can be increased in its speed. In any case, care must be taken here, in that the cycle, at which the substrate passes the sputter surface, is made asynchronous to the cycle of the magnet arrangement motion. In the case of a cycle of the substrate movement in synchrony with that of magnet arrangement, it becomes necessary, in some instances, that additional manipulation of the sputter rate be employed, which said rate is synchronized with the substrate movement, FIG. 8 presents the simulated curve of the coating layer thickness apportionment on a plane substrate, which, in accord with FIG. 4, has been moved over the sputter surface a plurality of times along motion path A-B. In this drawing, D designates the diameter of the circular sputter surface, and the positions $y_1$ and $y_2$ show the corresponding locations on the substrate 27 of FIG. 4. The y-direction corresponds to the y-direction on the substrate, in accord with FIG. 4, that is to say, the y-direction in accord with the FIGS. 2, 3. Curve (a) shows the layer thickness, if the sputter coating apparatus is used without the invented sputter-rate modulation and without use of the aperture orifice. The curve (b) exhibits, again without use of the invented sputter-rate modulation, but with the provision of an aperture orifice 29', as this is shown in FIG. 8. The curve (c) designates the result in the case of the invented employment of the cyclic variation, i.e., modulation, of the sputter rate, in accord with the phase locked cyclic movement of the magnet arrangement, as this is also brought about as per FIGS. 3, 4. A modulation curve was used, the spectrum of which has basically a specifically harmonic, superimposed spectral line. The simulated curves in accord with FIG. 8 have essentially proven themselves in the meantime in practice. By the omission of the aperture orifice 29' and the use of measures in accord with the present invention, essentially, all of the material set free from the sputter surface reaches the substrate, which leads to a significantly increased coating rate, along with shorter coating times and greater productivity. According to FIG. 8, the coating rate is increased, about some 18%. This is accomplished during a uniform, average electrical consumption at the magnetron source and beyond this, especially with a method in accord with FIG. 4, showing efficient use of target material, all leading to better operational life of the coating equipment. By the use of an aperture orifice, it is possible, that the loss relative to the coating rate cannot be simply compensated by an increase of the applied electrical load, because the maximum usable electric sputter load at the target is generally limited by the efficiency of the provided target cooling.

In a case of a reactive magnetron sputter coating apparatus process, wherein (not shown) in all executable forms of the present invention, between the magnetron sputter source and the substrate, a reactive gas is released, there arises accordingly, deficiencies in the layer quality due to excessive source loading. Because of such excessive loading, the reaction process of the material set free changes with the reactive gas, which in turn leads to stoichiometric changes of the deposited material. In this case, it is possible, for example, that the optical absorption in one or more layers, because of the said changed stoichiometry, is increased in a disturbing amount.

The second of the above mentioned three substrate movement types is as shown in FIG. 4, i.e., non-linear, and specially along a circular path AB'. The path of movement of the substrate, possesses in this situation, as is obvious, both a movement component $M_x$, that is in the direction of A-B as well as a movement component perpendicular thereto, namely $M_y$. An asymmetric layer thickness apportionment arises therefrom, in relation to the y-extension of the substrate. This is made clear by an observation of FIG. 7. In the y-direction, displaced substrate areas are moved with different velocities over areas of different lengths on the sputter surface in relation to the magnetron sputter sources extending along axis z. The corresponding results evolved in FIG. 8 for this case are presented in FIG. 9. The curve of the layer thickness upon the coating with one arrangement, as this is shown in FIGS. 4, 2, without the use of the invented sputter rate modulation and without the use of an aperture orifice is shown in (a). In order to compensate for the strongly imhomogeneous apportionment (a) with an aperture orifice 29", it is necessary that the latter be appropriately asymmetrically shaped. The curve of the coating with the provided aperture orifice 29", but without the use of the invented sputter rate modulation, is indicated by the curve (b). The curve (c) shows the layer thickness apportionment with the use of the invented sputter rate modulation. In this situation, analogous observations regarding FIG. 8, a modulated, cyclic curve was chosen, which, first, because of the substrate motion in the x-direction corresponding to $M_x$ of FIG. 4, with the doubled frequency of the cyclic magnetic arrangement movement, its frequency spectrum exhibits a predominate spectral amplitude. Second, however, in order to consider the rate differences due to the different movement radii of the different substrate units in the y-direction in accord with discussion of FIG. 7, a further predominate spectral amplitude can be attained, wherein the frequency equals the frequency of the cyclic magnet arrangement motion.

Employed is a simple, mirror symmetric magnet arrangement with an offset axis of rotation in accord with FIG. 4, since, in the case of a double-axis symmetrical magnet arrangement, for example in the form of a figure "8" with a sputter rate modulation with predominate modulation frequency, which corresponds to that of the magnet arrangement motion, no asymmetry in the sputter rate and the therewith associated coating rate can be achieved. If a simple mirror symmetric magnet system in accord with FIG. 4 is employed, then it becomes possible to reach the necessary asymmetry with the design of this magnet system, which carries out the remaining homogenizing of the layer thickness apportionment in the manner of FIG. 8, that is to say, with linear movement components in the direction of A-B in accord with FIG. 4, with the aid of the sputter rate modulation, holding to the doubled frequency, based on the frequency of the cyclic magnet arrangement motion.

Both in the case of a linear substrate path parallel to the sputter surface, as well as in the case of a curved substrate path, again parallel to the substrate surface it is possible, as has been described, with the aid of the sputter rate modulation, especially realized by means of sputter capacity modulation in accord with FIG. 3, to achieve a very good layer thickness apportionment, without the necessity, that aperture orifices must be installed. Thereby, an optimization of the layer thickness apportionment is enabled by means of an external variable process parameter, namely the electrical sputter loading. Essentially for the optimal functioning of the invented dynamic layer thickness apportionment correction measures, the speed, that is, the rate of change, with which the electrical load, which is conducted to the source, can be altered. With the present day, commercially obtainable power-supplies, an additional possibility is, to modulate the output loading in the small signal type, that is, typically plus or minus 1 to 10% about the static operational point loading, with frequencies up to the range of above 100 Hz without significant signal inrush. In this way, even complex modulation curve shapes with basic frequencies in the range of more than 10 Hz and significant high spectral portions can be made with considerable exactness and without essential phase slipping. This is important for a precise running of the modulation and the phase locking with the cyclic magnet arrangement motion.

The greater coating rate, i.e. sputter rate, can also, in accord with the invention, be attained in a case of a reactive magnetron sputter process. The relevant time-constant, (which lies in a range exceeding ca. 100 msec) for the stability of the reactive process is dependent upon the process, for example, dependent upon the relative gas pressure, sputter rate, chamber geometry, vacuum pump characteristics and the like. In the case of a cycle frequency, that is, the rotational frequency, of the magnet arrangement 25, 5, as seen in FIGS. 4, 3, of a few Hz, the relevant time-constant $\tau=1/(2rf)$ for the changing of the coating rate, for example, the sputter rate lies definitely under this cited 100 msec, whereby the influencing of the reactive process is only minimal. In other words, the reactive process is normally too sluggish, than that it can be particularly disturbed by the invented, actively used, sputter rate modulation.

FIG. 10 shows, schematically, the third case of the substrate motion, in accord with which, possibly additional to the formulation of the movement path, as presented in FIG. 4, the movement path, seen in a direction parallel to the sputter surface of the source 21, is curved, advantageously in accord with a circular arc. In this case, besides the already explained sputter rate, modulation course, which relates to the path A-B or A-B', this phase locked with the cyclic motion of the magnet arrangement—as this is explained in WO 00/71774 is—the sputter rate changes with an additional modulation, now, however, synchronized with the substrate movement, in order to even out the stringy effect mentioned in the introductory passages.

The optimization of the layer thickness apportionment in accord with the present invention, and especially by means of the externally available process parameter "sputter loading" enables also a matching to the actual erosion condition of the target in the concept of a placement of the modulation curve shape onto currently appearing relationships. In this way, it is possible that the remainder dependency of the layer thickness apportionment by means of the operational life of the target can easily be eliminated. Because the influencing of the apportionment by means of the changing, that is to say, because of the modulation of the sputter rate, especially in a case wherein modulation of the sputter loading is done practically without delay and enables a partitioning by in-situ-control. In this way, with the aid of an appropriate in-situ measurement system the presently effective layer thickness apportionment at the moment is done, for example, through the so called broad-band spectral monitoring and the measurement result can be used as a control-value in a regulation circuit for the control of the layer thickness apportionment.

This is presented schematically and in dotted lines in FIG. 3. By means of the measurement system 40 for layer thickness in-situ, the instantaneous layer thickness apportionment on the substrate 11 is determined. At a comparator unit 42, the measured apportionment is compared with an existing memory statement 44 of a specified apportionment, which was input in the form of, so to speak, a table. The output of the comparator 42, with the control difference Δ, is actively bound at the control input $S_{17}$ of the modulation default unit 17, and at this location, the course of the sputter rate modulation in the function of the control difference Δ which appears at the output of the comparator 42 is held up to such a time, until the measured layer thickness apportionment no longer deviates from the specified apportionment W, as this difference is given within the allowable remaining control deviation Even if greatly emphasized in the course of the description of the present invention, attention is directed to the achieving of an optimized, homogeneous layer thickness apportionment on the produced substrates. It is, without further consideration, obvious, that by means of an appropriate design of the sputter rate modulation, determination may be made as to what kind of a basic frequency, curve characteristic, and phase situation should be properly associated with the movement cycle of the magnet arrangement. Other desirable layer thickness apportionments on the substrate can be attained, when seen in a direction transverse to the motion direction of the substrate which substrate is in the form of a plane and is parallel to the sputter surface.

What is claimed is:

1. A method for manufacturing a coated substrate coated by magnetron sputtering, the method comprising:
   a) providing a magnetron source with a sputter surface, the magnetron source generating a magnetron magnetic field pattern along the sputter surface;
   b) circularly rotating said magnetron magnetic field pattern along said sputter surface;
   c) positioning a substrate to be coated a distance from and facing said sputter surface;
   d) moving said substrate along said sputter surface; and
   e) varying an amount of material deposited on said substrate per time unit from said magnetron source that is phase-locked with said circularly rotating said magnetron magnetic field pattern.

2. The method of claim 1 further comprising cyclically moving said magnetron magnetic field pattern in two dimensions.

3. The method of claim 1 further comprising cyclically moving said magnetron magnetic field in at least one of a rotational pendular manner and a rotational manner with respect to an axis perpendicular to said sputter surface.

4. The method of claim 1 further comprising cyclically varying said amount of material simultaneously along the entire sputter surface.

5. The method of claim 1 further comprising varying said amount of material by varying at least one of a flow of a reactive gas and a flow of a working gas into an area between said sputter surface and said substrate.

6. The method of claim 1 further comprising varying said amount of material by controlling a power applied to said magnetron source.

7. The method of claim 1 further comprising varying said amount of material with a time course having a frequency spectrum with a significant spectral line at a double frequency of a fundamental frequency of cyclically moving said magnetron magnetic field pattern.

8. The method of claim 7 wherein said time course has a further significant spectral line at the fundamental frequency of cyclically moving said magnetron magnetic field pattern.

9. The method of claim 1 further comprising tailoring said magnetron magnetic field pattern symmetrically to an axis in a plane which is parallel to said sputter surface.

10. The method of claim 1 further comprising tailoring said magnetron magnetic field pattern symmetrically with respect to two mutually perpendicular axes in a plane which is parallel to said sputter surface.

11. The method of claim 1 further comprising applying a reactive gas into an area between said sputter surface and said substrate.

12. The method of claim 1 wherein said sputter surface comprises a circular surface.

13. The method of claim 1 further comprising not influencing a material flow distribution from said sputter surface to said substrate.

14. The method of claim 1 further comprising selecting a time course of varying said amount of material with respect to at least one of a relative movement between the substrate and the sputter surface, a shape of said magnetron magnetic field pattern, and a movement course of said magnetron magnetic field pattern.

15. The method of claim 1 further comprising time varying a course of varying said amount of material.

16. The method of claim 1 further comprising monitoring a distribution of material momentarily deposited on said substrate, comparing said monitored distribution with a desired distribution, and adjusting characteristics of varying said amount of material as a function of a difference between said desired distribution and said monitored distribution in a negative feedback control loop.

17. The method of claim 1 further comprising repeatedly moving said substrate along said sputter surface.

18. The method of claim 1 further comprising cyclically moving said substrate along said sputter surface in at least one of a single direction motion and a forth and back motion.

19. The method of claim 1 further comprising moving said substrate along said sputter surface linearly as considered in a view towards said sputter surface.

20. The method of claim 1 further comprising moving said substrate within a plane parallel to said sputter surface.

21. The method of claim 1 further comprising moving said substrate along a non-linear trajectory path as considered in a view parallel to said sputter surface.

22. The method of claim 1 further comprising moving said substrate along a non-linear path as considered in a view onto said sputter surface.

23. The method of claim 1 further comprising moving said substrate along a circular trajectory path as considered in a view towards said sputter surface about a center remote from said sputter surface.

24. The method of claim 1 further comprising superposing to said varying of said amount of material a further varying of said amount synchronized with said moving of said substrate.

25. The method of claim 1 wherein an optimized homogeneous coating thickness distribution is achieved on said substrate.

26. The method of claim 1 wherein an optimized homogeneous distribution of material stoichiometry is achieved along the coating of said substrate.

27. The method of claim 1 wherein the method of magnetron sputtering comprises a method of coating planar substrates.

28. The method of claim 1 wherein said coated substrate has a coating thickness deviation from an average coating thickness value which is less than or equal to 1% considered along a substrate surface that is greater than 1,000 $cm^2$.

29. The method of claim 1 wherein said coated substrate has a local deviation of deposited amount of material of at most 0.01% with respect to an average value along a substrate surface of at least 10 $cm^2$.

30. A magnetron sputtering apparatus comprising
   a) a magnetron sputter source having a sputter target with a sputter surface and a magnet arrangement, said magnet arrangement being coupled to a drive to be circularly rotated along a plane parallel to said sputter surface;
   b) a substrate conveyor arrangement for moving at least one substrate along said sputter surface; and
   c) a modulation arrangement circularly modulating an amount of material per time unit sputtered off said sputter surface, said modulation arrangement being phase locked with said drive.

31. The apparatus of claim 30 wherein said drive comprises one of a rotational pendular drive that generates rotational pendulum movement and a rotational drive that generates a rotational movement of said magnet arrangement with respect to an axis that is perpendicular to said sputter surface.

32. The apparatus of claim 30 wherein said modulation arrangement modulates the amount of sputtered off material per time unit simultaneously along the entire sputter surface.

33. The apparatus of claim 30 wherein said modulation arrangement comprises at least one of a reactive gas flow and a working gas flow adjusting member.

34. The apparatus of claim 30 wherein said modulation arrangement comprises an adjusting member for an electrical feed of said target.

35. The apparatus of claim 30 wherein said magnet arrangement is shaped symmetrical to an axis which is parallel to said sputter surface.

36. The apparatus of claim 30 wherein said magnet arrangement is shaped symmetrical with respect to two mutually perpendicular axes parallel to said sputter surface.

37. The apparatus of claim 30 further comprising a gas inlet that is positioned adjacent to said magnetron source, said gas inlet being connected to a gas tank arrangement comprising a reactive gas.

38. The apparatus of claim 30 wherein said target comprises a circular target.

39. The apparatus of claim 30 wherein said target is formed of a single material.

40. The apparatus of claim 30 wherein there is direct sight communication between said sputter surface and said substrate conveyor arrangement.

41. The apparatus of claim 30 further comprising a monitoring arrangement that monitors a local distribution of material deposited on a substrate at said substrate conveyor arrangement, an output of said monitoring arrangement being operationally connected to an input of a comparing unit, a second input of said comparing unit being operationally connected to an output of a setting unit, an output of said comparing unit being operationally connected to a control input of an adjusting unit of said modulation unit.

42. The apparatus of claim 30 wherein said conveyor arrangement is operationally connected to a cyclical drive.

* * * * *